(12) United States Patent
Kuo et al.

(10) Patent No.: US 6,331,950 B1
(45) Date of Patent: Dec. 18, 2001

(54) WRITE PROTECT INPUT IMPLEMENTATION FOR A SIMULTANEOUS OPERATION FLASH MEMORY DEVICE

(75) Inventors: Tiao-Hua Kuo, San Jose, CA (US); Yasushi Kasa, Kawasaki (JP); Johnny C. Chen, Cupertino, CA (US)

(73) Assignees: Fujitsu Limited, Kanagawa (JP); Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/421,757

(22) Filed: Oct. 19, 1999

(51) Int. Cl.[7] ...................................................... G11C 7/00
(52) U.S. Cl. .............................. 365/185.18; 365/189.04; 365/189.06; 365/189.11
(58) Field of Search ......................... 365/185.19, 189.01, 365/189.11, 189.04, 189.06

(56) References Cited

U.S. PATENT DOCUMENTS

| | | | |
|---|---|---|---|
| 5,263,000 | 11/1993 | Buskirk et al. | 365/226 |
| 5,291,446 | 3/1994 | Buskirk et al. | 365/189.09 |
| 5,612,921 | 3/1997 | Chang et al. | 365/226 |
| 5,708,387 | 1/1998 | Cleveland et al. | 327/536 |
| 5,841,696 | 11/1998 | Chen et al. | 365/185.11 |
| 5,847,998 | 12/1998 | Buskirk | 365/185.33 |
| 5,867,430 | 2/1999 | Chen et al. | 365/189.04 |
| 5,905,389 * | 5/1999 | Alleven | 327/108 |
| 5,912,849 * | 6/1999 | Yasu et al. | 365/195 |
| 6,005,803 | 12/1999 | Kuo et al. | 365/185.11 |
| 6,011,725 | 1/2000 | Eitan | 365/185.33 |
| 6,016,270 | 1/2000 | Thummalapally et al. | 365/185.11 |
| 6,054,881 * | 4/2000 | Stoenner et al. | 327/112 |
| 6,069,519 * | 5/2000 | Song | 327/536 |
| 6,078,206 * | 6/2000 | Watari | 327/320 |

OTHER PUBLICATIONS

Brian Dipert and Markus Levy "Designing with Flash Memory—The definitive guide to designing flash memory hardware and software for components and PCMCIA cards", Annabooks, ISBN 0–929392–17–5, Ch. 3, pp. 23–44.
AMD, Technology Background brochure, "3.0 Volt–only Page Mode Flash Memory Technology."
AMD, Technology Background brochure, "3.0 Volt–only Burst Mode Flash Memory Technology."
AMD, Technology Background brochure, "1.8 Volt–only Flash Memory Technology."
AMD, Technology Background brochure, "AMD DL160 and DL320 Series Flash: New Densities, New Features."
Intel Corporation, "Common Flash Memory Interface Specification", Release 1.1, May 30, 1997.
AMD, "Common Flash Memory Interface Publication 100—Vendor & Device ID Code Assignments", Jul. 25, 1996, vol. 96.1.
AMD "Am29DL162C/AM29DL163C 16 Megabit (2 M×8–Bit/1 M×16–Bit) CMOS 3.0 Volt–only, Simultaneous Operation Flash Memory", Publication 21533, Rev: C Amendment/+2, Jul. 14, 1999.
Intel Corporation, "1.8 Volt Intel® Dual–Plane Flash Memory 28F320D18 (×16)", Product Review Datasheet, Order No.: 290672–002, Oct. 1999.

(List continued on next page.)

*Primary Examiner*—Son T. Dinh
(74) *Attorney, Agent, or Firm*—Wagner, Murabito & Hao LLP

(57) ABSTRACT

An input circuit for a flash memory device is disclosed. The input circuit includes an input for receiving a voltage signal from an external source representing a digital logic signal. The input circuit further includes a pull up circuit which is coupled with the input and pulls the input to a high logic level when the input is not connected to any external source.

12 Claims, 8 Drawing Sheets

OTHER PUBLICATIONS

Macronix International Co., Ltd. "MXIC Advance Information MX29VW160T/B—16M–Bit [2M×8–Bit/1M×16–Bit] Simultaneous Read/Write Single 2.5V Operation Flash Memory", P/N:PM0567, Rev. 0.8, May 17, 1999.

ATMEL Corporation, "ATMEL® 16–megabit (1M×16/2M×8) 3–volt Only Flash Memory", Rev. 0925H–08/99.

STMicroelectronics, "M59DR032A, M59DR032B, 32 Mbit (2Mb×16, Dual Bank, Page) Low Voltage Flash memory", preliminary date, Oct. 1999, pp. 1–38.

"AMD—Flash Introduction", obtained at the internet address http://www.amd.com/products/nvd/overview/flash_intro.html, Apr. 14, 1999.

"AMD—Simultaneous Read/Write", obtained at the internet address http://www.amd.com/products/nvd/overview/simuintro.html, Jul. 12, 1999.

"AMD News Release #9879", obtained at the internet address http://www.amd.com/news/prodpr/9879.html.

"Intel® 1.8 Volt Dual–Plane 32–Mbit Flash Memory (D18)", obtained at the internet address http:///www.intel.com/design/flcomp/prodbref/298131.htm, Nov. 18, 1999.

U.S. Patent Application, Serial No. 09/159, 023, filed Sep. 23, 1998.

U.S. Patent Application, Serial No. 09/159,142, filed Sep. 23, 1998.

U.S. Patent Application, Serial No. 09/159, 489, filed Sep. 23, 1998.

Bernd Laquai, Harald Richter, Bernd Hofflinger, "A New Method and Test Structure for Easy Determination of Femoto–Farad On–Chip Capacitances in a Mos Process", Proc. IEEE 1992 Int. Conference on Microelectronic Test Structures, vol. 5, March 1992, pp. 62–66.

C. Kortekaas, "On–Chip Quasi–Static Floating–Gate Capacitance Measurement Method", Proc. IEEE 1990 Int. Conference on Microelectronic Test Structures, vol. 3, March 1990, pp. 109–113.

Bruce W. McGaughy, James C. Chen, Dennis Sylvester, Chenming Hu, "A Simple Method for On–Chip, Sub–Femto Farad Interconnect Capacitance Measurement", IEEE Electron Device Letter, vol. 18, No. 1, January 1997, pp. 21–23.

Bruce W. McGaughy, James C. Chen, Dennis Sylvester, Chenming Hu, "An On–Chip Attofarad Interconnect Charge–Based Capacitance Measurement (CBCM) Technique", IEEE Tech. Digest International Electron Devices Meeting, December 1996.

Dennis Sylvester, James C. Chen, Chenming Hu, "Investigation of Interconnect Capacitance Characterization Using Charge–Based Capacitance Measurement (CBCM) Technique and 3–D Simulation", IEEE 1997 Custom Integrated Circuits Conference, pp. 491–494.

Dennis Sylvester, James C. Chen, Chenming Hu, "Investigation of Interconnect Capacitance Characterization Using Charge–Based Capacitance Measurement (CBCM) Technique and Three–Dimensional Simulation", IEEE Journal of Solid–State Circuits, vol. 33, No. 3, March 1998, pp. 449–453.

Dennis Sylvester, James C. Chen, Chenming Hu, "An On–Chip, Interconnect Capacitance Charcterization Method with Sub–Femto–Farad Resolution", IEEE Transactions on Semiconductor Manufacturing, vol. 11, No. 2, May 1998, pp. 204–210.

Dennis Sylvester, Chenming Hu, Sam O. Nakagawa, "Interconnect Scaling: Signal Integrity and Performance in Future High–Speed CMOS Designs", 1998 Symposium on VLSI Technology Digest of Technical Papers, pp. 42–43.

Samuel O. Nakagawa, Dennis M. Sylvester, John McBride, Soo–Young Oh, "On–Chip Cross Talk Noise Model for Deep–Submicrometer ULSI Interconnect", August 1998, The Hewlett–Packard Journal, pp. 39–45.

A. Khalkhal, P. Nouet, "On–Chip Measurement of Interconnect Capacitances in a CMOS Process", Proc. IEEE 1995 Int. Conference on Microeletronic Test Structures, vol. 8, March 1995, pp. 145–149.

G.J. Gaston and I.G. Daniels, "Efficient Extraction of Metal Parasitic Capacitances", Proc. IEEE 1995 Int. Conference on Microelectronic Test Structures, vol. 8, March 1995. pp. 157–160.

AMD Internal Correspondence, "CS44E6 Test Chip Electrical ILD Capacitance Measurement Tile", Oct. 20, 1997.

* cited by examiner

WRITE PROTECT INPUT IMPLEMENTATION FOR A SIMULTANEOUS OPERATION FLASH MEMORY DEVICE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Computers, personal digital assistants, cellular telephones and other electronic systems and devices typically include processors and memory. The memory is used to store instructions (typically in the form of computer programs) to be executed and/or data to be operated on by the processors to achieve the functionality of the device. In some applications, the systems and devices may require that the instructions and/or data be retained in some form of a permanent/non-volatile storage medium so that the information is not lost when the device is turned off or power is removed. Exemplary applications include computer BIOS storage and diskless handheld computing devices such as personal digital assistants.

One way to provide such non-volatile storage capability is to include a mass-storage device such as a hard disk drive. Hard disk drives are mechanical devices which store data on rotating magnetic platters. However, such devices may be difficult to fit in small systems and may have significant reliability, cost and manufacturing constraints. An alternative to such devices are integrated-circuit based non-volatile memories. One type of non-volatile memory that can be used is Erasable Programmable Read Only Memory ("EPROM"). While conventional EPROM's provide reliable non-volatile storage, they may not be able to be reprogrammed in the field in a practical manner. For example, EPROM's typically require exposure to ultraviolet light to erase them which may require that the EPROM memory chips be removed from the device. Once erased and reprogrammed, they are placed back in the device. In many applications, removing the memory to reprogram the device is not practical. In addition, besides not being easily reprogrammed, EPROM's may not have satisfactory data storage densities.

To avoid the complexity of EPROM's and to provide a device that can be reprogrammed in the field, many electronic designs use Electrically Erasable Programmable Read Only Memory ("EEPROM"), Static Random Access Memory ("SRAM") or flash memory, which can be reprogrammed electrically and without special hardware. SRAM is not technically a form of non-volatile memory but can be used in some applications requiring non-volatile capability.

EEPROM has the disadvantages of being expensive and having a very limited life cycle, i.e. an EEPROM can only be erased and rewritten a limited number of times before the device becomes non-functional. SRAM offers high operating speeds but only maintains its contents as long as power is supplied, therefore requiring a battery or other power source. This necessitates additional hardware to maintain power to the SRAM to preserve the stored contents which increases manufacturing cost and complexity. Further, the additional hardware may put undesirable constraints on the physical size of the design. In addition, EEPROM's and SRAM's may not have as high a data storage density as compared to other forms of storage. Therefore, where cost, size or density is a factor, flash memories are preferred because they may be simpler to reprogram in the field then EPROM's, less expensive than EEPROM's, easier to implement than battery-backed SRAM's and available in higher data storage densities.

Flash memory (or flash RAM) is a form of non-volatile storage which uses a memory cell design with a floating gate. High voltages are applied to the memory cell inputs to program/store charge on the floating gate or to erase/remove charge from the floating gate. Programming occurs by hot electron transfer to place charge on the floating gate while erasure makes use of Fowler-Nordheim tunneling in which electrons pierce through a thin dielectric material, reducing the amount of electronic charge on the floating gate. Erasing a cell sets the logical value of the cell to "1" while programming the cell sets the logical value to "0". Aside from programming or erasing operations, a flash memory operates similarly to a randomly accessible read only memory (ROM). Conventionally, a flash memory chip, including the flash memory storage cells and support logic/circuitry, is made by fabricating layers of semiconductor material and interconnect layers of polysilicon and first and second metal layers onto a substrate. It will be appreciated that there are numerous integrated circuit fabrication techniques, involving more or fewer layers, which are applicable herein.

Prior flash memories could only be erased by erasing the entire memory chip also known as bulk erasure. Byte by byte erasure was not possible. To somewhat alleviate this problem, modern flash memory is typically divided logically into blocks called "sectors" where each sector contains a portion of the total bytes of data storage available. For example, a typical flash memory may have 32 megabits of total storage and be logically broken down into 64 sectors, each sector containing 64 Kilobytes of data (one byte being equal to eight bits). This arrangement allows for the option of erasure of one sector at a time in addition to bulk erasure of the entire memory. While typical flash memories are still incapable of byte by byte erasure, data in the flash memory may still be programmed byte by byte (or sometimes word by word, where a word equals four bytes) depending on the implementation. It will be appreciated that the granularity by which a flash memory device can be programmed or erased may vary and that granularities down to bit level programming/erasure are contemplated.

In order to program and/or erase a flash memory, typically a complex process must be followed. For example, before erasing a particular sector, that sector must be programmed (known as "pre-programming"). These steps of erasing and programming involve complex application of high voltages to the memory cells for specified periods of time and in particular sequences. Many flash memories provide embedded state machines which perform the complex programming and erasing operations automatically. These processes of programming and erasing a flash memory may take a long time to complete. A typical erase sequence can take anywhere from 0.7 seconds up to 15 seconds per sector. To erase an entire chip can take up to 49 seconds depending on the number of sectors. While programming is much faster, on the order of 7 to 300 microseconds per byte, it is still slow compared to other memory devices. Programming an entire chip can still take up to 120 seconds (including the time to verify the data) depending on the capacity of the chip. Typically, standard Dynamic Random Access Memory ("DRAM") offers write access times on the order of nanoseconds, a difference between flash memory of many orders of magnitude.

This complex nature of programming and erasing flash memory devices leads to a major problem in that they do not provide sufficiently fast write access which then affects read accesses. For example, conventional flash memory devices typically do not allow a processor to perform a read operation while a program or erase operation is underway in the flash memory device. In most implementations, the processor is required to periodically poll a status register of the flash memory device to detect the end of the program or erase operation before initiating a read operation to the flash memory device.

Unfortunately, as noted above, the programming and erase cycle times for typical flash memory devices are orders of magnitude greater than acceptable write access times of a conventional random access main memory using, for example, Dynamic Random Access Memory ("DRAM"). Such long latencies associated with programming or erase operations can lock up the operating system and prevent the system from functioning for unacceptably long time intervals if the flash memory is the only memory in the electronic system. Some prior flash memories allow erase suspend operations in order to address this problem. Erase suspend allows the processor to pause an erase operation so another sector can be read. However, such memories typically still impose a suspend latency interval of several microseconds before a read operation can be initiated. A typical suspend latency interval is from 0.1 to 20 microseconds.

Prior systems may employ multiple flash memory devices in an attempt to prevent such operating system lock up. In such systems, the processor usually has read access to one of the flash memory devices while other flash memory devices are undergoing a program or erase operation. However, such systems typically suffer from high costs because multiple flash memory devices are implemented even though the capacity of a single flash memory device may accommodate the needs of the particular electronic device.

Another prior art system uses a flash memory in combination with an EEPROM memory. This system allows a read operation of one of the memories while writing to the other. However, the size of an EEPROM memory cell is significantly larger than that of a flash memory cell which reduces the amount of storage that can be placed on the memory chip. Further, there are significant design and manufacturing complexities involved with integrating two different memory technologies on the same chip. Therefore, a device which uses an EEPROM in combination with a flash memory will typically be more expensive both to design and manufacture.

In addition, programming and erasing a flash memory involves higher than normal voltages as compared to performing read operations. The use of these higher than normal voltages can cause problems when trying to implement the capability to simultaneously read while programming/erasing. Such problems include difficulties in distributing the high voltages required for the program and erase operations along with normal voltage for read operations and handling increased noise induced on the read sense outputs by the use of high voltages elsewhere within the device. Further, depending on the implementation, redundant logic may also be employed which introduces further complexities.

Accordingly, there is a need for an efficiently designed and manufacturable flash memory device that allows simultaneous read and write operations.

SUMMARY OF THE INVENTION

The present invention is defined by the following claims, and nothing in this section should be taken as a limitation on those claims. By way of introduction, the preferred embodiments described below relate to an input circuit for a flash memory device. The input circuit includes an input for receiving a voltage from an external source. The input circuit further includes a pull up circuit which pulls the input to a high logic level when there is no external voltage source connected to the input. In this way, standby current draw is reduced when the input is left unconnected which reduces the overall power consumption of the device and prevents detrimental effects on th e internal circuitry. Also, indeterminate logic values created by the floating input are eliminated. In addition, the preferred embodiments also provide the advantage that one input pin can be used for both high voltage and normal operating voltage based functions. Further, a write protect function is provided which utilizes normal chip operating voltages which are more convenient for end users.

DETAILED DESCRIPTION OF THE PRESENTLY PREFERRED EMBODIMENTS

Herein, the phrase "coupled with" is defined to mean directly connected to or indirectly connected with through one or more intermediate components. Referring now to the Figures and in particular, FIG. 1, there is schematically shown a flash memory device 100 according to the present invention that provides for reading while simultaneously undergoing a program or erase operation. The memory device 100 according to the present invention may include one or more components of the memory devices disclosed in U.S. Pat. No. 5,867,430 entitled "BANK ARCHITECTURE FOR A NON-VOLATILE MEMORY ENABLING SIMULTANEOUS READING AND WRITING," to Chen et al and U.S. Pat. No. 5,847,998 entitled "NON-VOLATILE MEMORY ARRAY THAT ENABLES SIMULTANEOUS READ AND WRITE OPERATIONS," to Van Buskirk, the entire contents of both of which are herein incorporated by reference and further describe the implementation and operation of a device of this type. The memory device 100 may also include one or more components of such exemplary flash memory devices capable of simultaneous read and write operation as the Am29DL162C and Am29DL163C 16 megabit ("Mb") flash memory chips and the Am29DL322C and Am29DL323C 32 Mb flash memory chips manufactured by Advanced Micro Devices, Inc. located in Sunnyvale, Calif. For more detail regarding these exemplary flash memory chips, refer to "Am29DL322C/Am29L323C 32 Megabit (4M×8-Bit/2M×16-Bit) CMOS 3.0 Volt-only, Simultaneous Operation Flash Memory" Datasheet and "Am29DL162C/Am29L163C 16 Megabit (2M×8-Bit/1M×16-Bit) CMOS 3.0 Volt-only, Simultaneous Operation Flash Memory" Datasheet. While the exemplary devices disclosed above have capacities of 16 or 32 Mb, it will be appreciated that the embodiments disclosed herein are equally applicable to devices with higher bit densities such as 64 or 128 Mb devices.

In a typical embedded application of the above exemplary simultaneous operation capable flash memory 100, the available data storage space can be structured to store data and boot code in one bank and control code in another bank. The control code, which can contain command sequences which tell one bank, for example, bank 196, to program/erase data sectors, can reside as executable code in the alternate bank, for example bank 194. While the first bank is being programmed/erased, the system can continue to execute code from the alternate bank to manage other system operations. Similarly, depending on the system implementation, the CPU can also execute code from the first bank while the alternate bank undergoes a program/erase. There is no bank switching latency and no need to suspend the program/erase operation to perform the read. This minimizes the CPU's read/write cycle time, maximizes data throughput and reduces overall system cost by eliminating the need for additional hardware. It will be appreciated that while the exemplary devices have two banks of memory cells, devices with more than two banks are contemplated.

Figure 1:
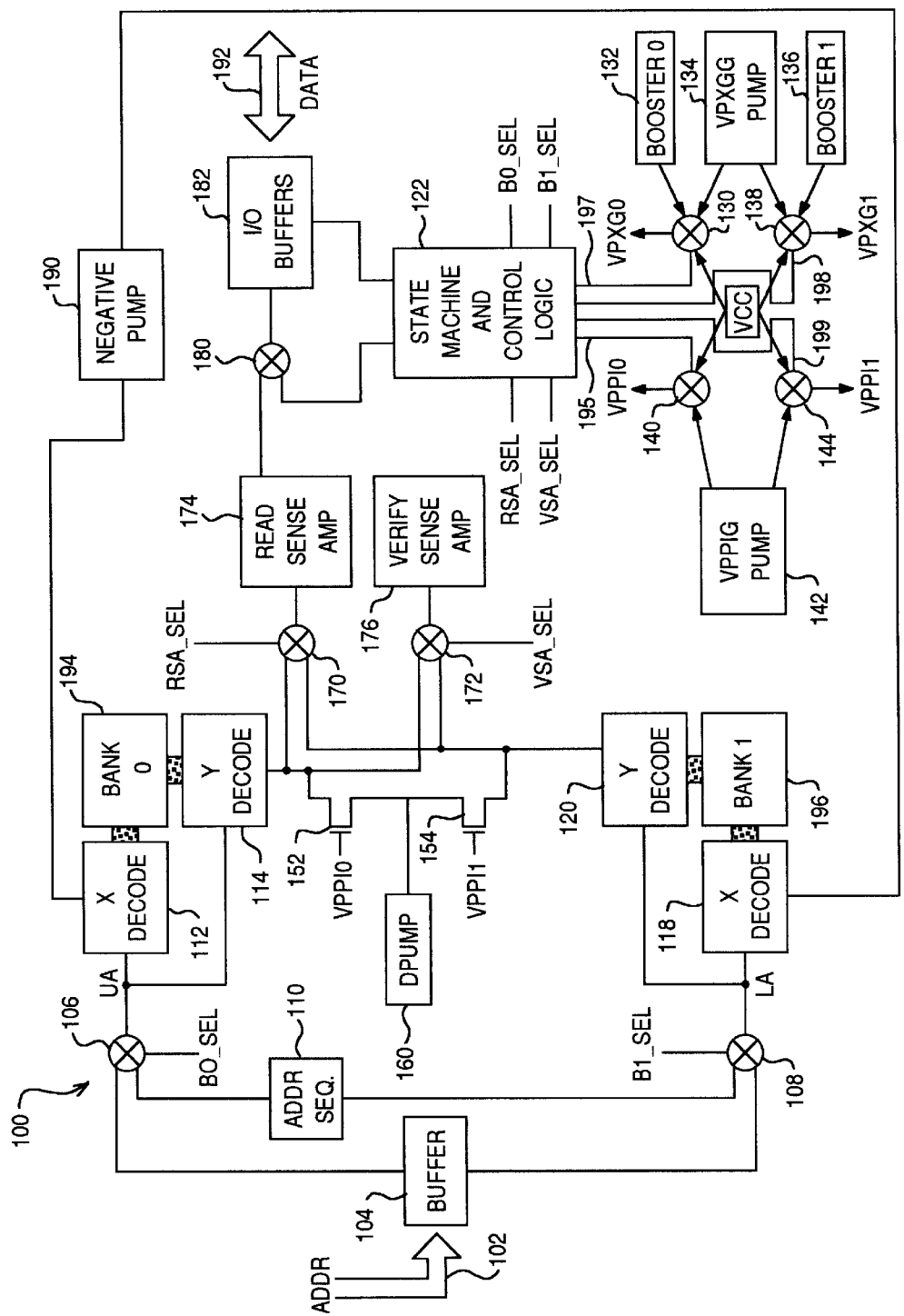
FIG. 1 depicts a block diagram of a flash memory chip according to the present invention that is capable of simultaneous reading and writing.

Again referring to FIG. 1, the memory device 100, according to an embodiment of the present invention with a capacity of 32 Mb and operating in word addressable mode, includes a 21 bit address input 102, a 16 bit data input/output ("DATA") 192, power inputs (not shown in FIG. 1) and control inputs (not shown in FIG. 1). It will be appreciated that the memory device 100 with a capacity of 16 Mb only requires 20 address bits and when operating in byte mode, the 32 Mb device 100 requires 22 address bits and the 16 Mb requires 21 address bits. The control inputs include Chip Enable, Output Enable, and Write Enable. The Chip Enable signal activates the chip's control logic and input/output buffers. When Chip Enable is not asserted, the memory device operates in standby mode. Output Enable is used to gate the outputs of the device through I/O buffers during read cycles. Write Enable is used to enable the write functions of the memory device. In one embodiment, all of the components of FIG. 1 are contained on a single integrated circuit chip. Note that address and control inputs for the exemplary flash memory chips are dependent on memory density and interface implementations. It will be appreciated that the disclosed embodiments can work with higher memory densities and alternate interface implementations with their accompanying alternate address and control input configurations.

The memory device 100 further includes address buffer 104, address multiplexers 106 and 108, address sequencer 110, X logical address decoders 112 and 118, Y logical address decoders 114 and 120, memory array Banks 0 and 1 denoted as 194 and 196 respectively, Dpump 160, data multiplexers 170 and 172, read sense amplifiers 174, verify sense amplifiers 176, negative pump 190, output multiplexer 180, state machine and control logic 122, input/output buffers 182, VPPIG Pump 142, booster 0 denoted as 132, VPXGG Pump 134, booster 1 denoted as 136 and power multiplexers 130, 138, 140 and 144. The address input 102 is received by the address buffer 104, which sends the address to the address multiplexer 106 for bank 194 and the address multiplexer 108 for bank 196. The address sequencer 110 is controlled by the state machine and control logic 122. In one embodiment, the address sequencer 110 is part of the state machine and control logic 122. The output of the address sequencer 110 is an address which is sent to both multiplexer 106 and multiplexer 108. The address sequencer 110 is used to generate sequential addresses during an erase sequence. The output of the multiplexer 106, upper address UA, is communicated to the X address decoder 112 and the Y address decoder 114. The output of the multiplexer 108, lower address LA, is sent to the X address decoder 118 and the Y address decoder 120. The multiplexer 106 chooses between the address from the buffer 104 and the address from the address sequencer 110 in response to a control signal B0_SEL. The multiplexer 108 chooses between the address from the address buffer 104 and the address from address sequencer 110 based on a control signal B1_SEL. The selection signals B0_SEL and B1_SEL are generated by the state machine and control logic 122.

Bank 194 and bank 196 are arrays (or sets) of flash memory cells (operation of these individual flash memory cells is discussed in more detail below). The banks 194, 196 are organized by words and then by sectors and can either be byte or word addressable. It will be appreciated by those skilled in the art that other types of non-volatile memory are also within the scope of the present invention. The address decode logic for bank 194 includes the X address decoder 112 and the Y address decoder 114. The X address decoder 112 includes a word line decoder and sector decoder. The word line decoder receives address bits UA[6:14] and the sector decoder receives address bits UA[15:20]. The Y address decoder 114 includes a bit line decoder and Y bit line gating. The bit line decoder receives address bits UA[0:5].

The address decode logic for bank 196 includes the X address decoder 118 and the Y address decoder 120. The X address decoder 118 includes a word line decoder and a sector decoder. The word decoder receives address bits LA[6:14] and the sector decoder receives address bits LA[5:20]. The Y address decoder 120 includes a bit line decoder and Y bit line gating. The bit line decoder receives address bits LA[0:5]. In one embodiment, the address buffer 104 includes a latch to store the address being decoded. In another embodiment, the latch can be part of the decoders 112, 114, 118, 120.

FIG. 1 further shows a multiplexer 130 with three inputs: booster zero 132, VPXGG pump 134 and Vcc. The VPXGG pump 134 is a positive power supply for generating and supplying a regulated positive potential to the control gate of selected flash memory cells via the word lines. Many different voltage pumps known in the art are suitable for use in the present invention. A more detailed explanation of one technology which can be included in VPXGG pump 134 can be found in U.S. Pat. No. 5,291,446, "VPP POWER SUPPLY HAVING A REGULATOR CIRCUIT FOR CONTROLLING A REGULATED POSITIVE POTENTIAL" to Van Buskirk et al, the entire contents of which are incorporated herein by reference. Booster 132 is used to boost the word line during reads. The multiplexer 130 receives a selection signal 197 from state machine and control logic 122 and chooses one of its three inputs to send to the word lines of bank 194 via the X address decoder 112. The output of the multiplexer 130 is labeled as VPXG0. FIG. 1 is drawn to show the three inputs 132, 134 and Vcc connected to a multiplexer in order to simplify the disclosure. A more detailed description of one exemplary implementation can be found in U.S. Pat. No. 5,708,387, "FAST 3-STATE BOOSTER CIRCUIT", to Cleveland et al, the entire contents of which are incorporated herein by reference. Many booster circuits and selection circuits known in the art are suitable for use in the present invention.

FIG. 1 also includes another multiplexer 138 having three inputs: booster one denoted as 136, VPXGG pump 134 and Vcc. Booster 136 is similar to booster 132. The multiplexer 138 operates in a similar fashion to multiplexer 130, and receives its selection signal 198 from the state machine and control logic 122. The output of multiplexer 138 is VPXG1 which is sent to the word lines of bank 196 via the X address decoder 118. The purpose of the multiplexers 130 and 138 is to switch between the three power lines depending on the operation being performed on the particular bank of memory cells.

The VPPIG pump 142 is a high voltage pump used to pass high voltage to the drain of the memory cells. The output of the VPPIG pump 142 is sent to multiplexer 140 and multiplexer 144. Both multiplexers also have Vcc as an input. Multiplexers 140 and 144 switch between inputs based on signals 195 and 199 from the state machine and control logic 122. The output of multiplexer 140 is VPPI0 and the output of multiplexer 144 is VPPI1. During a normal read operation, VPPI1 and VPPI0 are connected to Vcc. VPPI0 is connected to the gate of an N-channel transistor 152. VPPI1 is connected to the gate of an N-channel transistor 154. The source of transistor 152 is connected to Y address decoder 114, multiplexer 170 and multiplexer 172. The drain of transistor 152 is connected to the Dpump 160 and the drain of transistor 154. The Dpump 160 is a drain power supply. Various drain power supplies, known in the art, can be used for the present invention. One exemplary drain pump is disclosed in U.S. Pat. No. 5,263,000, "DRAIN POWER SUPPLY", to Van Buskirk, et al., the entire contents of which are incorporated herein by reference. The source of transistor 154 is connected to multiplexer 170 and multiplexer 172. The source of transistor 154 is also connected to Y address decoder 120 for purposes of accessing the bit lines in bank 196. The connections to multiplexers 170 and 172 provide a path for reading data from bank 194 and bank 196. Multiplexer 170 uses the signal RSA_SEL from the state machine and control logic 122 to selectively choose one of the two input signals to communicate to the read sense amplifiers 174. Multiplexer 172 uses the selection signal VSA_SEL from the state machine and control logic 122 in order to selectively communicate one of its two input signals to the verify sense amplifiers 176. Thus, the two transistors (152 and 154) and the two multiplexers (170 and 172), are used to selectively pass voltages to the drains of selected cells in bank 194 or bank 196 and to selectively read data from either bank 194 or bank 196. For the sake of clarity, the implementation of multiplexers 170 and 172 is illustrative only. Some of the implementation details are not shown in FIG. 1. In the memory device 100, there are actually two sets of sense amplifiers, one set for each bank 194, 196. There are also two sets of verify sense amplifiers. Data from the banks is multiplexed from each bank 194 or 196 to either its read sense amplifier or its verify sense amplifier. When a bank 194 or 196 is using its read sense amplifier, its verify sense amplifier is turned off and vice versa. It will be appreciated that there are many ways to multiplex multiple data sources among multiple destinations.

Data from either bank 194 or bank 196 can be communicated to either the read sense amplifiers 174 or the verify sense amplifiers 176. Both sense amplifiers are in communication with the state machine and control logic 122. While data from bank 194 is communicated to the read sense amplifiers 174, data from bank 196 can be communicated to the verify sense amplifiers 176. While data from bank 194 is communicated to the verify sense amplifiers 176, data from bank 196 can be communicated to the read sense amplifiers 174. The output of the verify sense amplifiers 176 is sent to the state machine and control logic 122, which is used to verify that a particular byte has been programmed or erased. Note that in the memory device 100, the preferred implementation of the read sense amplifiers 174 provides two sets of sense amplifiers, one for each bank 194, 196. Only the sense amplifiers for the bank 194 or 196 undergoing a read operation are active during the read operation. The verify sense amplifiers 176 of the memory device 100 also have two sets of verify amplifiers, one for each bank.

Data from the read sense amplifiers 174 is sent to multiplexer 180. A second input of the multiplexer 180 includes device 100 status information from the state machine and control logic 122 such as whether or not a program or erase is in progress. The selection signal for multiplexer 180 is provided by the state machine and control logic 122.

I/O buffers 182 are used to pass data out and receive data into memory device 100. While a read is being performed on one of the banks, multiplexer 180 will communicate output data from read sense amplifiers 174 to I/O buffers 182. During an erase or program sequence, multiplexer 180 will communicate status information to I/O buffers 182 so that an outside processor can poll the memory device 100 for the status in regard to the erase or program.

The memory device 100 also includes a negative pump 190 that is used to generate a relatively high negative voltage to the control gates of selected memory cells via the word lines of either bank 194 or bank 196, as selected by the state machine and control logic 122. The negative pump 190 is in communication with the X address decoders 112 and 118. One example of a negative pump can be found in U.S. Pat. No. 5,612,921, "LOW SUPPLY VOLTAGE NEGATIVE CHARGE PUMP", to Chang et al, the entire contents of which are incorporated herein by reference.

The state machine and control logic 122 provides the control for read, program and erase operations. Many of the selection lines used to select between bank 194 and bank 196 are controlled by the state machine and control logic 122. Alternatively, the output from the X and Y address decoders 112, 114, 118, 120 can be used to select between banks of memory cells.

The memory device 100 is programmed using an embedded programming sequence and is erased using an embedded erase sequence. The embedded sequences allow a processor to initiate a program or erase sequence and perform other tasks while the program and erase sequences are being carried out. The embedded program and erase sequences are controlled by the state machine and control logic 122, which uses a command register to manage the commencement of either sequence. The erase and programming operations are only accessed via the command register which controls an internal state machine that manages device operations. Commands are written to the command register via the data inputs 192 to the memory device 100.

While one bank is being programmed, the other bank can be accessed for a read operation. For example, during a program of a byte in bank 196, the state machine and control logic 122 would cause multiplexer 108 to select the address from buffer 104 for communication to decoders 118 and 120. Further, the state machine and control logic 122 would store the data byte to be programmed from the I/O buffers 182 for verification when the programming completes. The output of bank 196 would be sent to the verify sense amplifiers 176 via multiplexer 172 for comparison with the stored input data. During a simultaneously initiated read operation to bank 194, the state machine and control logic 122, after storing away the data to be programmed, instructs multiplexer 106 to select the address from the buffer 104 for communication to the X and Y address decoders 112 and 114. The output of bank 194 would be sent to the read sense amplifiers 174 via multiplexer 170. The output of the read sense amplifiers 174 would be sent, via multiplexer 180, to the I/O buffers 182 and then to the data bus 192.

Similarly, during an erase of a sector in bank 194, the state machine and control logic 122 would cause multiplexer 106 to select the addresses from the address sequencer 110. The address sequencer 110 would be used to cycle through all the bytes in a particular sector to make sure that each byte is preprogrammed. The sector is subsequently bulk erased. After erasure, the address sequencer 110 would be used to generate addresses to verify each byte of this erased sector. While bank 194 is being erased and multiplexer 106 is selecting an address from the address sequencer 110, a read operation can be carried out in bank 196 by using multiplexer 108 to select the address from the buffer 104 rather than an address from address sequencer 110. During the verify operation of the erase method for bank 194, the state machine and control logic 122 would be verifying the data using the verify sense amplifiers 176, while read data from bank 196 would be communicated to the read sense amplifiers 174. Thus, each bank has two input address paths and two output data paths that can be multiplexed so that either bank can be read from while the other bank is simultaneously being written to.

In the memory device 100, each memory cell, within the banks 194 or 196, includes a nor-type floating gate transistor. It will be appreciated by those skilled in the art, however, that there are many ways to implement a flash memory cell and that the configurations and operating characteristics may vary. It will further be appreciated that the embodiments disclosed herein are generally applicable and not limited to one particular implementation of a flash memory cell. The exemplary transistor has three connections called the source, drain and control gate. In a typical flash memory array, the control gates of the memory cells are connected to the word lines of the array which are used to address the data stored in the array. The sources are selectively connected to ground (for a read operation) depending on which bits are to be read. The drains are connected to the bit lines which are used to sense/read the stored data out of the array.

During an erase operation, the source input of the memory cell transistor is connected to a high positive voltage, the drain/bit line is left to float and the control gate/word line is connected to a relatively high negative voltage supplied by the negative pump 190. An exemplary high positive voltage applied to the source during an erase is approximately 5 volts and an exemplary high negative voltage applied to the control gate/word line by the negative pump 190 is approximately minus 9 volts although other voltages and input combinations can be used. Based on this input configuration, any charge stored on the floating gate of the memory cell transistor will discharge by flowing out to the source due to Fowler-Nordheim Tunneling.

During a program operation, the source input of the memory cell transistor is connected to ground, the drain/bit line is connected to a high positive voltage provided by the VPPIG Dpump drain power supply 142 and the control gate/word line is connected to a high voltage provided by the VPXGG pump positive power supply 134. An exemplary high voltage applied to the drain by the VPPIG 142 is approximately 5 Volts while an exemplary high voltage applied to the control gate by the VPXGG 134 pump is approximately 9 Volts. It will be appreciated by those skilled in the art that other voltage and input combinations can also be used. Based on this input configuration, charge will flow by hot electron transfer to the floating gate of the memory cell transistor and accumulate there.

While programming and erasing the memory cell require higher than normal voltages, reading from the cell only requires the availability of the normal supply voltage. To read from the memory cell, the source is connected to ground (also referred to as Vss) and the control gate/word line are connected to the booster power supplies 132, 136. Prior to selecting the transistors for a read, the bit lines are charged up via the Dpump 160. When the cells turn on (if erased), they will connect their respective bit line to ground, grounding out the bit line. The current value of the memory cell is then sensed from the drain/bit line connection. There is a booster power supply 132 for bank 194 and a booster power supply 136 for bank 196. The booster power supplies 132, 136 are used to boost the word lines of bank 194 or bank 196 during a read operation. An exemplary Vcc supply voltage is 3.0 Volts although other supply voltages are known in the art. An exemplary booster voltage is 5.0 Volts, although the use of the other voltages on the control gate for read operations is possible. If there is charge stored on the floating gate, i.e. the memory cell has been programmed, the flow of current from the drain to the source (ground) will be inhibited and the memory cell will read as a logical "0". If the memory cell has been erased, there will be no charge stored on the floating gate and with a voltage applied to the control gate greater than the threshold voltage of the transistor, current will flow from the drain to the source and the memory cell will read as a logical "1". Note that a transistor that is on, grounds its respective bit line. Data read out of the array is considered in its complimentary form, therefore the grounded bit lines are interpreted as logical 1's and the non-grounded bit lines are considered logical 0's.

Application of the particular voltages necessary for each operation is handled by the state machine and control logic 122. This logic 122 controls the multiplexers 130, 138, 140, 144 that place the proper voltages from the various power supplies 132, 134, 136, 142 and Vcc on the memory cell inputs depending on the desired function.

While the total capacity of the simultaneous read and write capable flash memory device 100 is 16 or 32 MB or higher, how that capacity is distributed among the available banks is variable. Users of simultaneous read and write capable flash memory may need different bank partition sizes depending on their applications. To meet the varying needs of users, the flash memory device 100 preferably implements a sliding bank architecture. This architecture allows the simplified design and manufacture of simultaneous flash memory devices with varied bank partition sizes. To alter the bank sizes, only a single metal layer of the chip needs to be altered. For a more detailed discussion of the sliding bank architecture, refer to co-pending and commonly assigned U.S. patent application Ser. No. 09/159,142, "SIMULTANEOUS OPERATION FLASH MEMORY DEVICE WITH A FLEXIBLE BANK PARTITION ARCHITECTURE", filed Sep. 23, 1998, U.S. patent application Ser. No. 09/159,023, "METHOD OF MAKING FLEXIBLY PARTITIONED METAL LINE SEGMENTS FOR A SIMULTANEOUS OPERATION FLASH MEMORY DEVICE WITH A FLEXIBLE BANK PARTITION ARCHITECTURE", filed Sep. 23, 1998 and U.S. patent application Ser. No. 09/159,489, "BANK SELEC- TOR CIRCUIT FOR A SIMULTANEOUS OPERATION FLASH MEMORY DEVICE WITH A FLEXIBLE BANK PARTITION ARCHITECTURE", filed Sep. 23, 1998, the entire contents of each of which are incorporated herein by reference. The sliding bank architecture enables the memory device 100 to be produced in many different configurations with only a single mask change in one of the final steps of production. In the case where the flash memory device 100 has a capacity of 32 megabits (Mb), partitions where bank 194 has a capacity 4 or 8 Mb and bank 196 has a capacity of 28 or 24 Mb respectively, can be used. In the case where the flash memory device 100 has a capacity of 16 Mb, partitions where bank 194 has a capacity of 2 or 4 Mb and bank 196 has a capacity of 14 or 12 Mb respectively, can be used. This has the advantages that many different configurations of the flash memory device 100 can share much of the same basic design, process and manufacturing expense.

As used herein, the phrase "high logic level" is used to indicate a logical 1 and the phrase "low logic level" is used to indicate a logic level of 0. It will be understood that the signals underlying these representations are actually represented by voltage values. A signal is said to be "asserted" when it has a value which is significant to the logic it is driving. Some signals are asserted when they are at a low logic level (also referred to as "active low" and labeled with a bar over the signal name or a B appended to the end of the signal name) and some signals are asserted when they are at a high logic level (also referred to as "active high"). It will be appreciated that all forms of digital logic representations are contemplated including mixed logic and multi-state representations. It will further be appreciated that the underlying voltages of the logic signals may also vary, with typical values being 2 or 3 Volts representing logic 1 and 0 Volts representing logic 0.

In an exemplary use of the flash memory device 100, the user loads the device 100 with the desired data for use in the end application. Once the data is loaded into the device 100, the user locks the device such that the contents cannot be overwritten either accidentally or intentionally without unlocking the device. In the memory device 100, this is known as hardware sector protection. Hardware sector protection in the memory device 100 is available on a sector by sector basis. As was discussed above, the total memory capacity of the memory device 100 is divided into sectors. In an exemplary sector configuration for the memory device 100 having a capacity of 32 Mb, the device 100 has 63 64-kilobit sectors and 8 8-kilobit sectors. The 64-kilobit sectors are referred to as large sectors and the 8-kilobit sectors are referred to as small sectors, boot sectors or bootblocks. The hardware sector protection feature of the device 100 disables both program and erase operations in any sector. Unprotecting a protected sector re-enables the ability to program or erase that sector.

The hardware sector protection is designed for use by manufacturers of larger devices which incorporate the memory device 100 into their design. To protect or unprotect sectors using the hardware sector protection, the manufacturer must apply specific high voltages to specific pin inputs of the device 100 to set the device 100 into a protection configuration mode. Once in this protection configuration mode, the manufacturer can specify which sectors to protect or unprotect. In the memory device 100, the manufacturer can place a high voltage, for example 8.5–12.5 Volts, on the RESET pin of the device 100 to enter the protection configuration mode. Typically, the memory devices 100 are first loaded with the application specific data using special programming equipment which facilitates high volume manufacture. Once loaded, the devices 100 are then placed inside the larger device. If the larger devices, which incorporate the device 100, are not designed to provide the high voltages necessary to enter the protection configuration mode, the end user will be unable to modify the stored information. This is useful to prevent accidental overwriting of the data stored in the device 100 by the end user. Even where the larger devices are capable of rewriting the device 100, the extra step of protection provides a guard against accidental loss of data.

In some applications, it is desirable to have a method of hardware protection which does not rely on the application of high voltages. This can be more convenient for the end user of the device 100. The memory device 100 provides a write protect function which utilizes the application of the normal chip operating voltage. The memory device 100 operates at a voltage of approximately 2 or 3 Volts. This functionality is implemented in the memory device 100 using a special input pin to the device 100.

Figure 2:
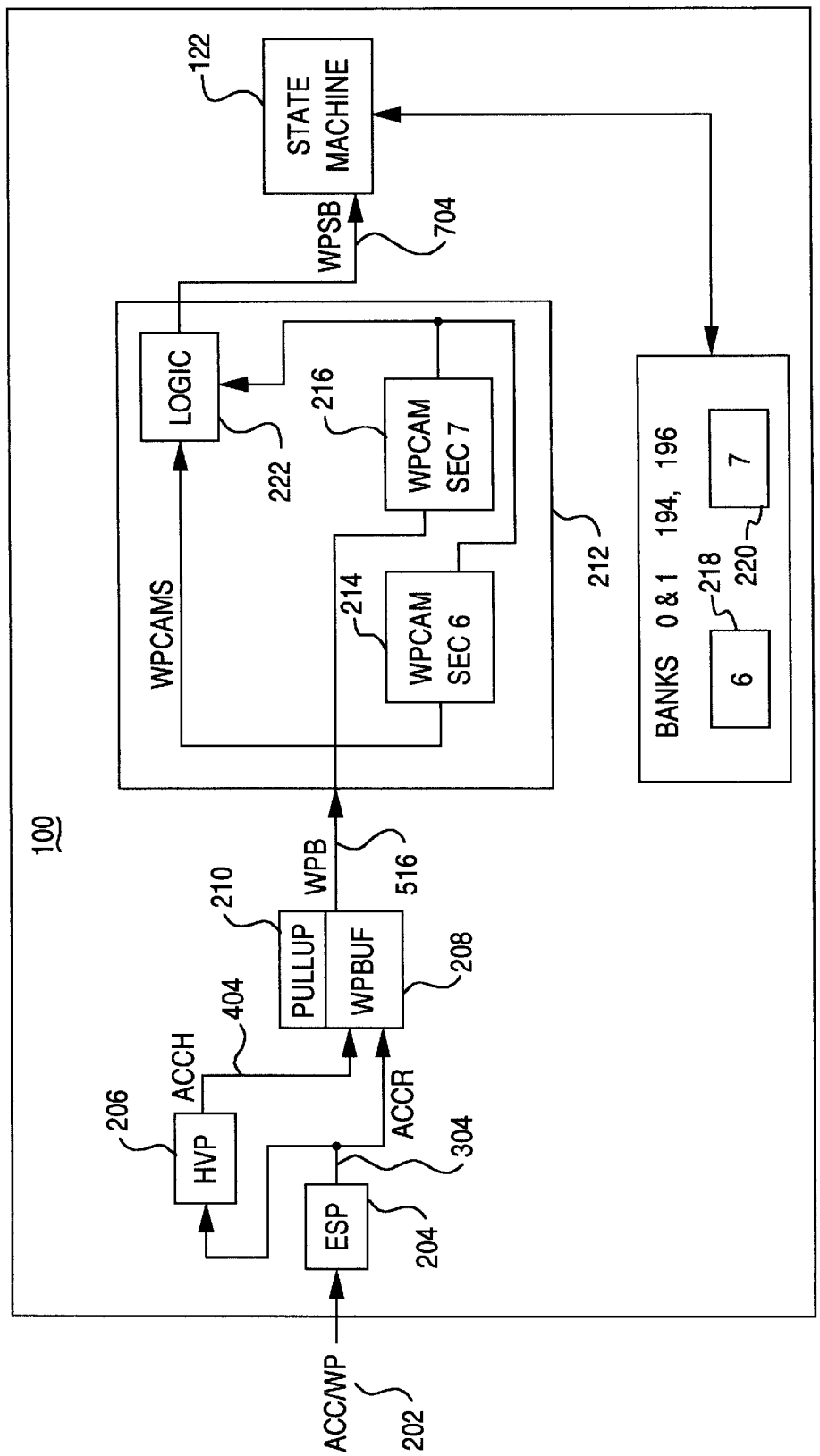
FIG. 2 depicts a block diagram of the flash memory chip of FIG. 1 showing the write protection logic according to the present invention.

In one embodiment of the present invention, a memory device 100 having a write protect input which reduces standby current when disconnected is provided. Referring to FIG. 2, there is shown a block diagram of the memory device 100 according to the present invention. For the sake of clarity, a number of the components of FIG. 1 have been deleted in FIG. 2. The device 100 further includes a write protect input 202 (labeled "ACC/$\overline{\text{WP}}$"), an electro-static discharge circuit 204 (labeled "ESD"), a high voltage detect circuit 206 (labeled "HVD"), a write protect buffer 208 (labeled "WPBUF"), and write protect content addressable memories 212 (labeled "WPCAMS"). The WPBUF 208 further includes a pull up circuit 210. The WPCAMS 212 further include a WPCAM circuit 214 for bootblock 6 (designated as 218) and a WPCAM 216 for bootblack 7 (designated as 220) as well as control logic 222.

In the device 100, the hardware protection scheme discussed above is implemented using content addressable memories ("CAM"). There is one CAM for each large sector and one CAM for each small sector/bootblock. Within each CAM is a flash memory cell which stores the protection status of the corresponding sector. As was discussed above, application of specific high voltages to specific inputs of the device 100 is necessary in order to enter the protection configuration mode and thereby change the data stored in the CAM's.

The memory device 100 provides an additional feature called the write protect function. The write protect function utilizes the write protect input 202 to protect or unprotect the two outermost bootblocks of the device 100 when configured as a bootblock device. A bootblock configured device has an asymmetric sector architecture where the first sector is of a smaller size than the remaining sectors, typically 8 or 16 Kb as compared to the remaining sectors which are typically 64 Kb. These sectors are intended to replace boot programmable read only memory and they can be used in applications where the device containing the flash memory will be storing boot up code. Other applications can also make use of this special bootblack memory. In a uniform configured device, all of the sectors in the flash array are of a uniform size. As noted above, the memory device 100 provides 8 8-kilobit bootblocks. The location of the bootblocks, within the address space of the device, is user configurable. In a top bootblock device, the bootblocks reside at the high end of the address space and in a bottom bootblock device, the bootblocks reside at the low end of the address space. For the memory device 100, the two outermost bootblocks are also referred to as bootblock 6 and bootblack 7.

Operation of the write protect function of the memory device 100 utilizes the standard operating input voltages of the device 100, also known as VIH and VIL. In the memory device 100, VIH can be 2 or 3 Volts. VIH is also the voltage which represents the high logic level. The voltage, VIL, is the low logic level. In the memory device 100, VIL is 0 Volts or ground. VIH and VIL are the voltage levels which external devices must adhere to in order to communicate with the memory device 100. It will be appreciated that operating voltages may vary depending upon implementation of the device 100. If the system, in which the memory device 100 is connected, asserts VIL on the write protect input 202 of the device 100, the device 100 disables the program and erase functions of the two outermost bootblocks. This will override any settings in the corresponding CAMS for the those sectors. If the system asserts VIH on the write protect input 202 of the device 100, the protection of the two outermost bootblocks will depend on the protection status of their corresponding CAM's. In addition, application of high voltage, for example 8.5 Volts or greater, will also cause the protection status of the two outermost bootblocks to be dependent on the status of the corresponding CAM's. Application of high voltage to this input 202 is used for certain test functions of the device 100.

Not all end users of the memory device 100 require the write protect function and the write protect input 202. These users may leave the write protect input 202 pin disconnected or ask that the device 100 be manufactured without this input pin (the pin is "not bonded out"). In these cases, the write protect input 202 would be in a floating state with an indeterminate voltage. This can cause inconsistent behavior in the device 100 and excessive standby current draw. Standby current is the current utilized by the device when it is idle. For example, standby current draw with the write protect input 202 in a floating state can be approximately 2–300 micro-amps. If the standby current draw becomes too excessive, the device 100 will not be within the specification for power consumption and will fail to qualify during final manufacturing testing. It is therefore advantageous not to allow the write protect input 202 to float when disconnected to minimize the standby current draw.

Referring back to FIG. 2, the write protect input 202 pin is connected with the ESD circuit 204. The ESD circuit 204 is an electro-static discharge circuit which is used to protect the internal circuitry of the device 100 from electro-static energy which may come through the input 202. ESD circuits 204 are well known in the art. The ESD circuit 204 passes its input to its output while dissipating any unwanted electro-static energy.

Figure 3:
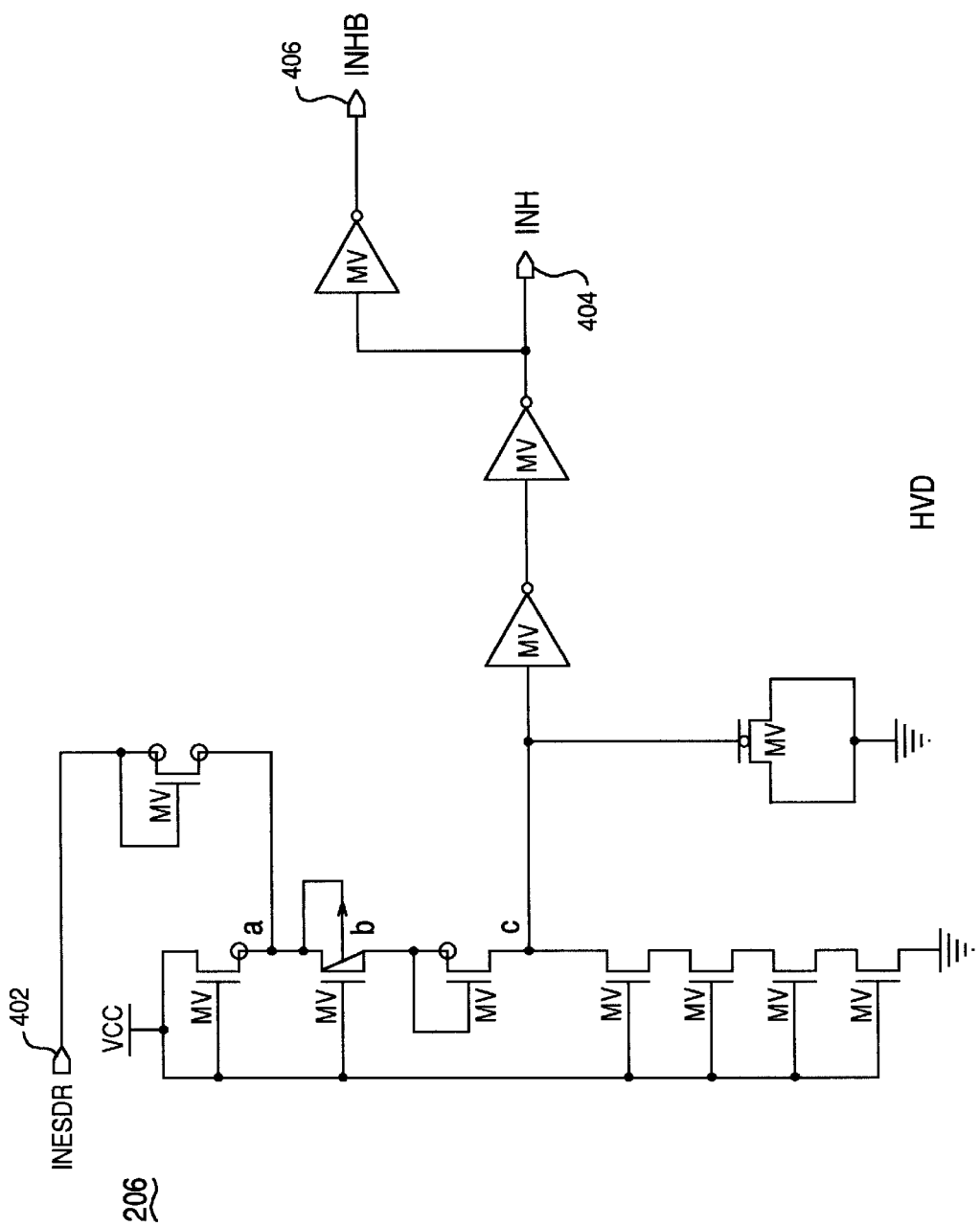
FIG. 3 depicts a schematic diagram of the high voltage detector circuit of FIG. 2.

The output of the ESD circuit 204, labeled "ACCR" is connected to the high voltage detector 206 and the WPBUF 208. Referring now to FIG. 3, a high voltage detector circuit 206 for use with the device 100 is depicted. The high voltage detector 206 has an input 402, an output 404 and an inverted output 406. When a high voltage is detected, the circuit 206 asserts a high logic level on the output 404 and a low logic level on the output 406. Otherwise, the circuit asserts a low logic level on the output 404 and a high logic level on the output 406.

Figure 4:
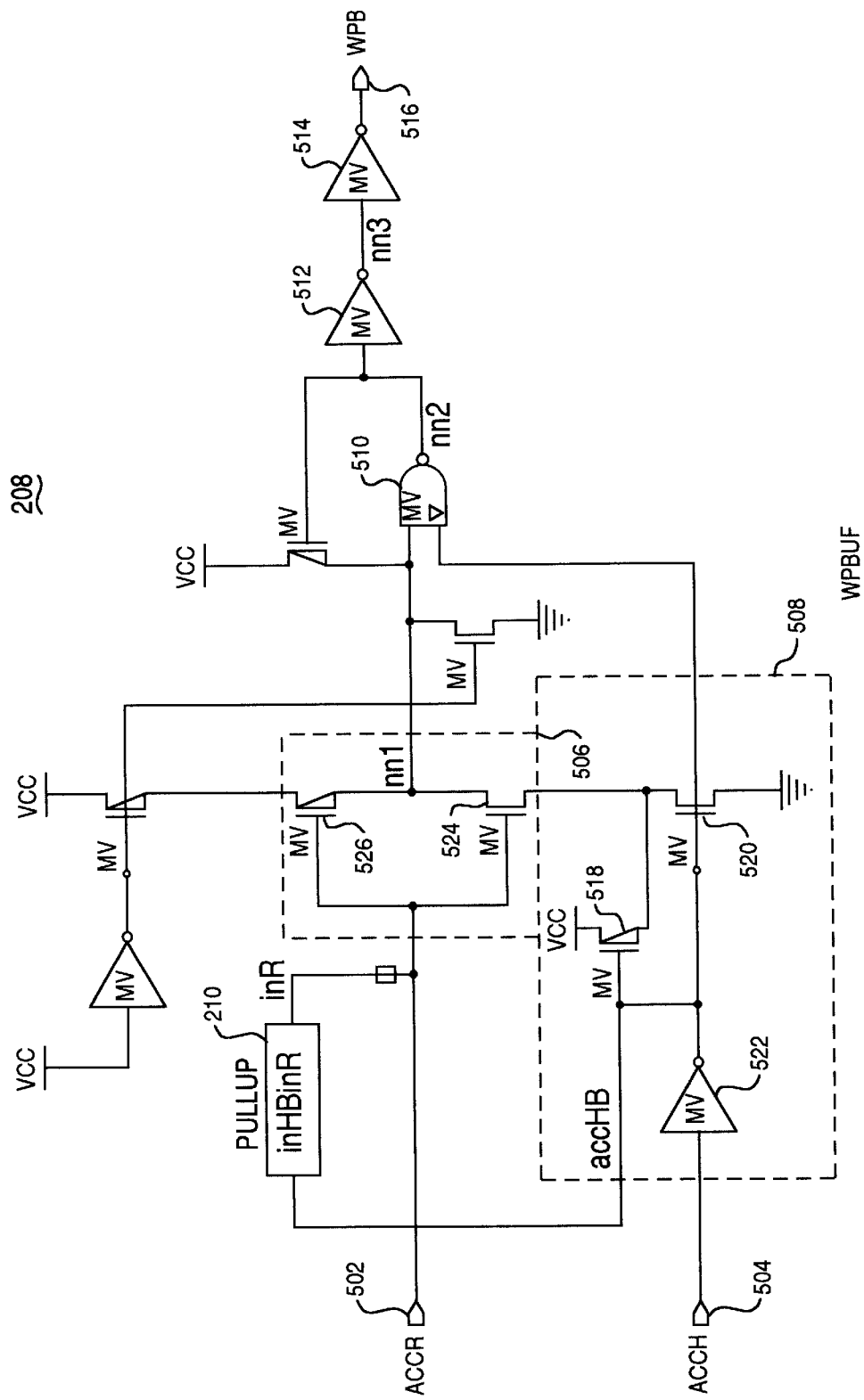
FIG. 4 depicts a schematic diagram of the write protect input buffer of FIG. 1.

Referring back to FIG. 2, the output of the high voltage detector circuit 206, labeled "ACCH" is connected to the WPBUF circuit 208. Referring now to FIG. 4, there is shown a WPBUF circuit 208 for use with the memory device 100. The WPBUF circuit 208 includes an input 502 for the write protect signal (labeled "ACCR") from the ESD circuit 204 and an input 504 for the high voltage detect output signal, labeled "ACCH", from the high voltage detector 206. The WPBUF circuit 208 further includes a pull up circuit 210 (depicted in FIG. 6 and described in more detail below), an inverter 506, a high voltage decoupler circuit 508, a NAND gate 510, inverters 512 and 514 and an output 516 labeled "WPB". During normal operation of the WPBUF circuit 208 where the write protect input 202 pin is connected to an external source, application of VIH to the input 202 is passed to the WPBUF 208 via input 502 by the ESD circuit 204. The VIH signal is inverted by the inverter 506 and passed to the NAND gate 510. VIH will not cause the high voltage detector 206 to detect high voltage, so the ACCH signal will be low. The ACCH signal is passed to the WPBUF circuit 208 via input 504 where it connects with the high voltage decoupler circuit 508. The high voltage decoupler circuit further includes inverter 522, p-channel transistor 518 and n-channel transistor 520. The ACCH signal 504 is inverted by inverter 522 and passed to the inputs of the transistors 518, 520 and the NAND gate 510. When ACCH is low, the p-channel transistor 518 will turn off and the n-channel transistor 520 will turn on. This will cause the inverter 506 to act normally.

With VIH on the write protect input 202, the NAND gate 510 will see a high logic level from the high voltage decoupler circuit 508 and a low logic level from the inverter 506 causing the NAND gate 510 to output a high logic level. The output of the NAND gate 510 is inverted by inverters 512 and 514 which results in an output from the WPB=1. WPB is active low and is the write protect signal indicating when the bootblocks 6 and 7 should be write protected. WPB=1 means that the two outermost bootblocks, bootblocks 6 and 7 should be unprotected. In this state, their protection will rely on their corresponding write protect CAM's.

When VIL is placed on the write protect input 202 pin, again the high voltage detector 206 will not see a high voltage therefore the write protect signal gets passed through inverter 506 to NAND gate 510. This time, the NAND gate 510 will see a 1 from the inverter 506 and a 1 from the high voltage decoupler circuit 508. This causes an output of 0 on the WPB output 516 indicating that bootblocks 6 and 7 should be protected.

When a high voltage is placed on the write protect input 202 pin, the high voltage detector 206 will detect the high voltage and assert a 1 on the ACCH input to the WPBUF circuit. This will be inverted by inverter 522, turning transistor 518 on and turning transistor 520 off. This will couple both ends of the inverter 506 circuit to Vcc preventing an excessive voltage drop across the inputs to the transistors which make up the inverter 506. This protects the WPBUF 208 circuitry from damage from the high voltage. The inverted ACCH input 504 is also passed to the NAND gate 510 causing the WPB output to be 1, which results in bootblocks 6 and 7 being unprotected.

When the write protect input 202 pin is unconnected, the ACCR input 502 to the WPBUF circuit 208 will float at an indeterminate voltage level. Without additional circuitry, this indeterminate voltage level may result in an indeterminate output from the inverter 506 and ultimately cause an indeterminate state of protection for bootblocks 6 and 7. In addition, the fluctuating voltage level will cause the inverter 506 to sink unnecessary standby current. As was noted before, it is advantageous to reduce the overall standby current draw of the device 100 to ensure that the device's 100 power consumption is within the specified limits. The typical standby current draw ranges from 0.2 to 5 micro-amps at Vcc=3 volts. Therefore, the pull up circuit 210 is provided to pull up the ACCR input 502 to a determinate high logic level when the write protect input 202 pin is unconnected. Note that when the write protect input 202 pin is unconnected, the output of the high voltage detector 206 will be 0, indicating no high voltage detected. The pull up circuit 210 is shown coupled with the ACCR input 502 and the inverted ACCH input 504 from the inverter 522. With the ACCR input 502 pulled up to a high logic level, the inverter 506 will output a 0, maintaining bootblocks 6 and 7 in an unprotected state dependent only on the status of the corresponding write protect CAM circuits 214, 216. In addition, with an input value of 1 to the inverter 506, the n-channel transistor 524 will be on connecting the output to ground and the p-channel transistor 526 will be off disconnecting Vcc from the output. This will prevent unnecessary current draw by the WPBUF 208.

Figure 5:
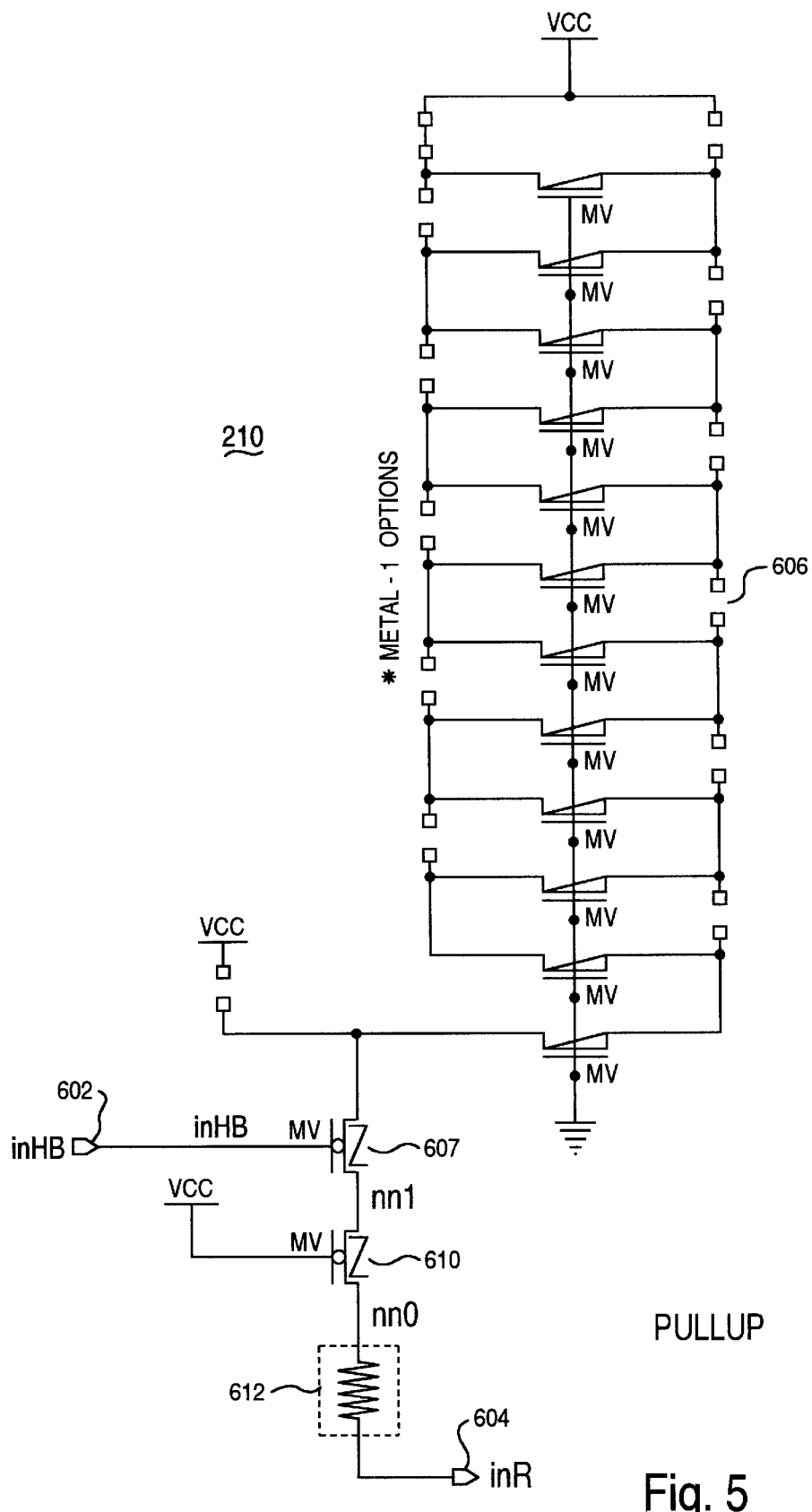
FIG. 5 depicts a schematic diagram of the pull up circuit of FIG. 5.

Referring now to FIG. 5, there is shown a pull up circuit 210 for use with the WPBUF circuit 208 of FIG. 5. The pull up circuit 210 has an input 602, labeled "inHB", an output 604, labeled "inR", a p-channel transistor pull up network 606, Z transistors 608 and 610 and resistor 612. The Z transistors 608 and 610 are n-channel intrinsic devices with a threshold voltage equal to 0 Volts. These devices 608 and 610 turn on when any positive voltage is applied the gate input. The input 602 is connected to the output of the inverter 522 in the high voltage decoupler circuit 508 of the WPBUF 208. When no high voltage is detected by the high voltage detector 206, the input 602 will be 1 and Z device 608 will be on. When high voltage is detected, this input 602 will be 0 and Z device 608 will be off, cutting off the current path. This protects the pull up circuit 210 from application of high voltages. Under normal operating conditions, when the ACCR input 502 to the WPBUF 208 has been left floating, the input 602 will be 1. This will allow the p-channel pull up network 606 to pull up the output 604 to Vcc, effectively pulling up the floating input 502 to the WPBUF 208. In the device 100, the value of the resistor 612 is approximately 10 KΩ. The transistors which make up the pull up transistor network 606 can be adjusted with second layer metal option circuits to adjust/reduce the amount of leakage current when the input 602 is at a low logic level. When the user is using the write protect input 202 and wants to pull the input 202 to a low logic level, the user will be fighting against the pull up circuit 210. The user trying to pull the input 202 low and the pull up circuit 210 trying to pull it high will cause some amount of leakage current. The resistor 612 and the pull up transistor network 606 are designed to reduce this leakage current and prevent the current draw from exceeding the device 100 specification. The metal option circuits in the pull up transistor network can be used to short one or more of the transistors together which will increase the current draw allowed. These metal option circuits are used to fine tune the current draw in the final stage of fabrication when the second metal layer is fabricated on the device 100.

Figure 6:
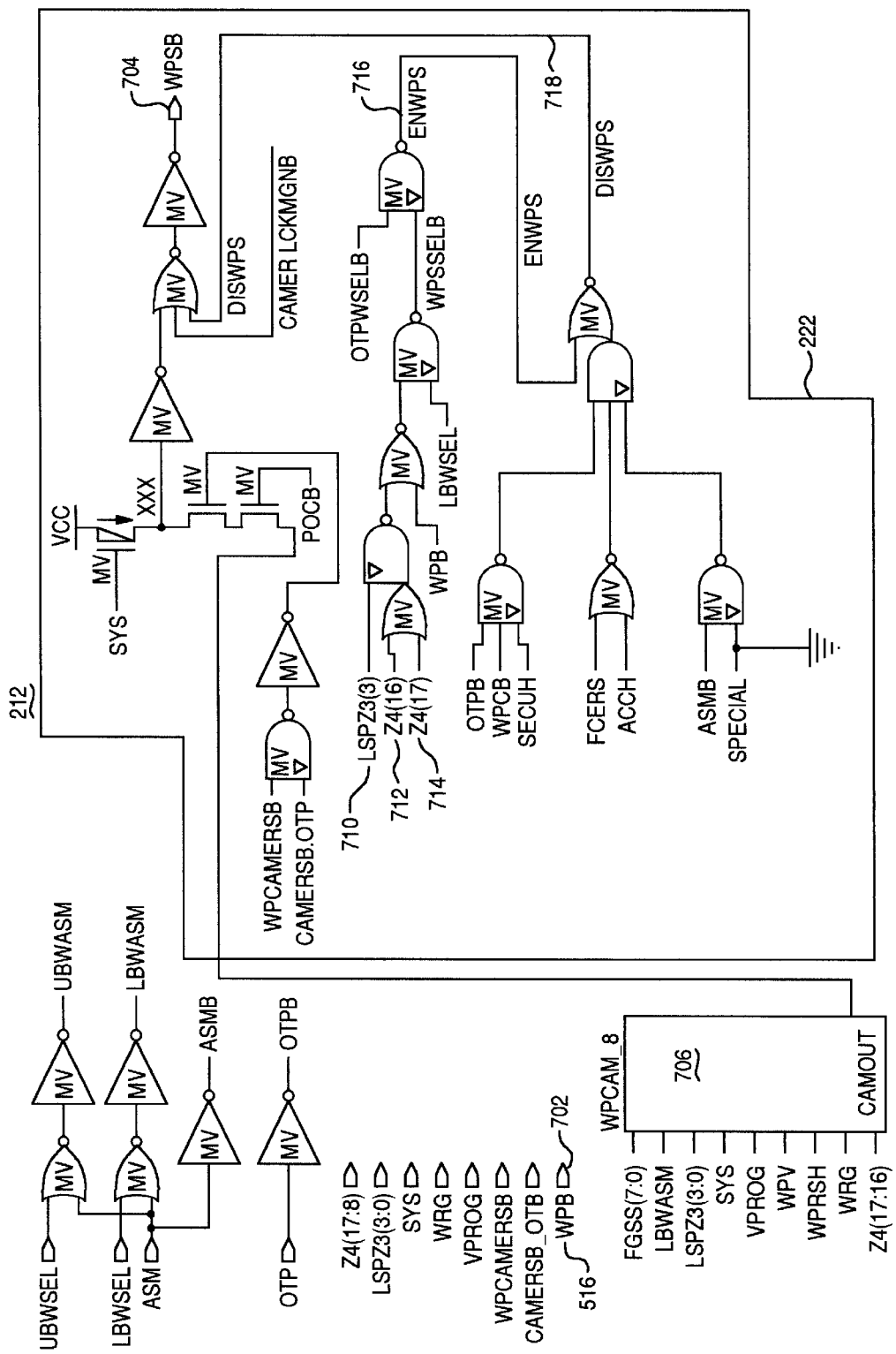
FIG. 6 depicts a schematic diagram of the WPCAM circuits of FIG. 2.

Referring now to FIG. 6, there is shown a schematic diagram of the WPCAMS 212. The WPCAMS 212 has an input 702 for the WPB output 516 from the WPBUF 208. This input 702 connects to the write protect content addressable memory ("CAM") circuits 706 for the 8 8-kilobit bootblocks and the control logic 222. The output of the CAM's 706 is used to generate the WPSB output 704 to the state machine and control logic 122. The control logic 222 has inputs 710 (labeled "LSPZ3(3)"), 712 (labeled "Z4(16)"), 714 (labeled "Z4(17)"). When bootblock 6 or 7 is selected for an operation, LSPZ3(3) 710 will =0 as will Z4(16) 712 or Z4(17) 714 (depending on which bootblack, 6 or 7). In combination with the WPB signal 516 and the output of the CAM circuits 706, this will force the WPSB output 704 low which indicates to the state machine and control logic 122 that bootblocks 6 and 7 are protected.

Figure 7:
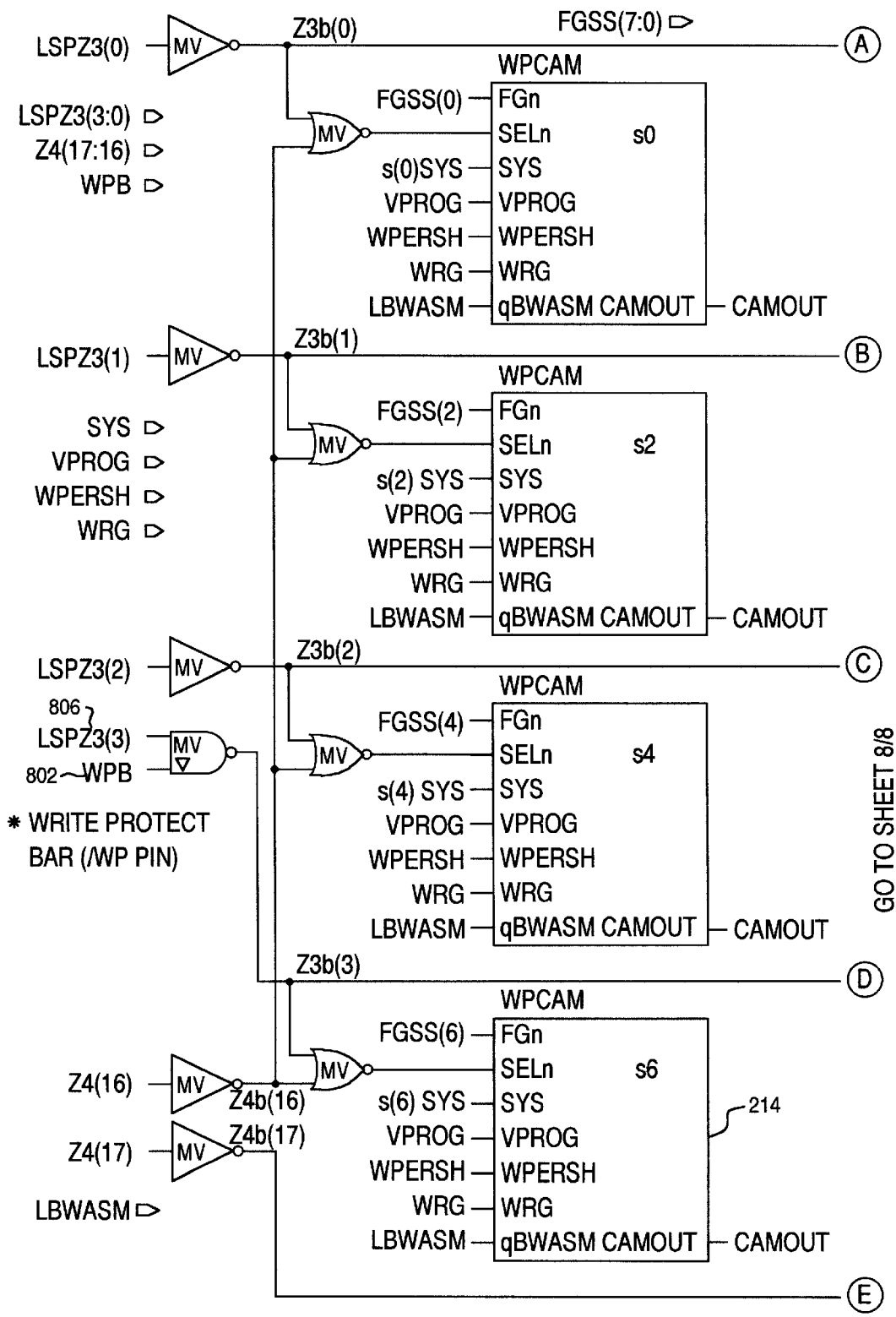
FIG. 7 depicts a schematic diagram of the sector CAM circuits of FIG. 2.
Figure 7:
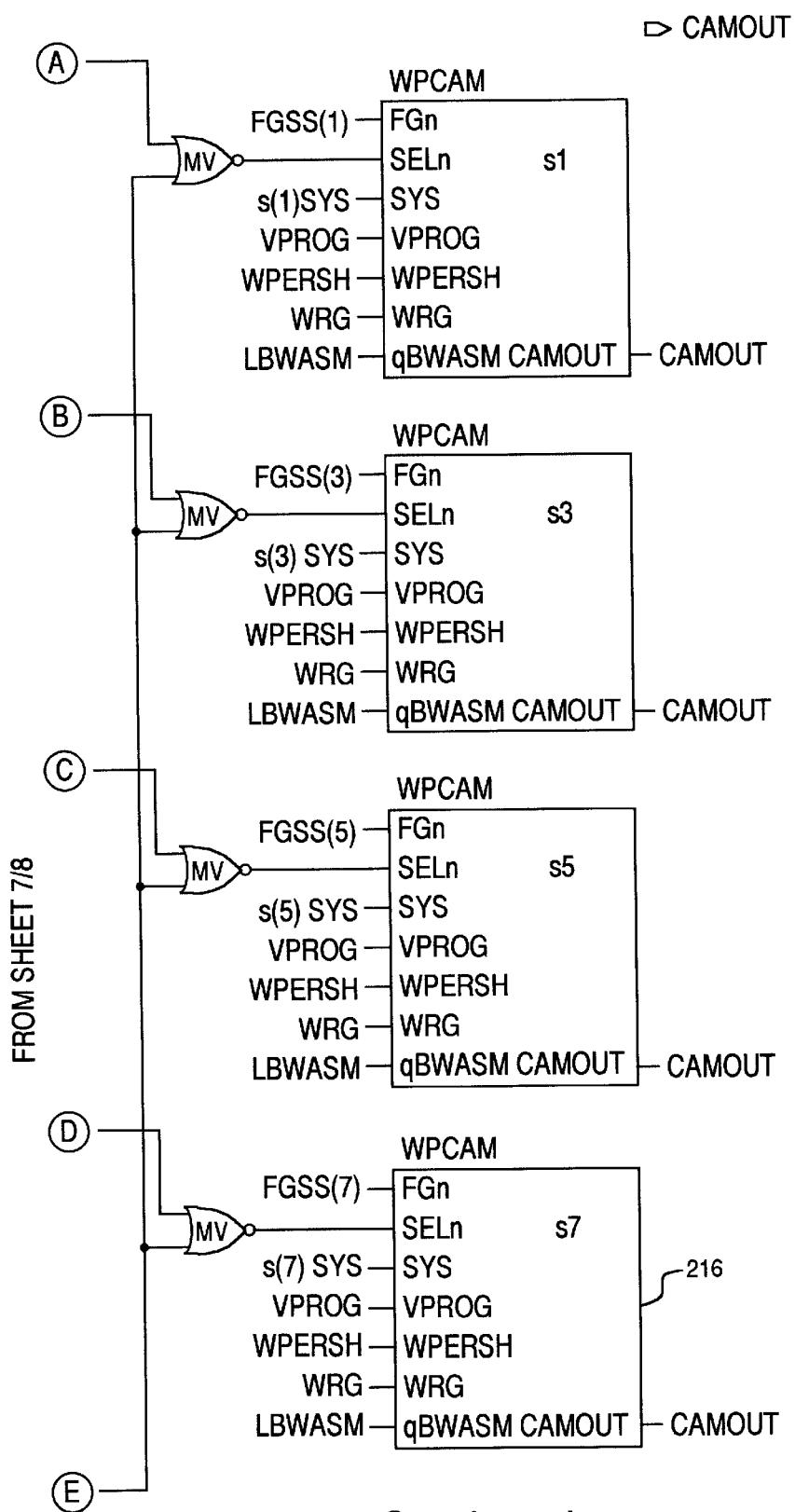

Referring now to FIG. 7, there is shown a schematic diagram of the CAM's 706 for the 8 8-kilobit bootblocks for use in the WPCAMS 212 of FIG. 7. The CAM's 706 include an input 802 for the WPB output 516 from the WPBUF 208, an input 806 (labeled "LSPZ3(3)"), a write protect CAM circuit 214 for bootblock 6 and a write protect CAM circuit 216 for bootblock 7. The CAM circuits 214 and 216 are connected to the inputs 802 and 806. The output of the CAM circuits 214 and 216 are connected to the output 804, labeled "CAMOUT". The write protect CAM circuits 214 and 216 contain the hardware protection status for bootblocks 6 and 7. The LSPZ3(3) 806 input indicates that the state machine and control logic is about to operate on either bootblock 6 or 7. The WPB 802 input indicates whether or not bootblocks 6 and 7 are protected. The circuit 706 forces the CAMOUT output 804 to a high state when bootblack 6 or 7 is selected for an operation but the bootblocks are currently protected. This effectively overrides whatever value is stored in the CAM circuits 214, 216 for the protection status of those bootblocks.

If bootblocks 6 or 7 are selected for a program or erase operation, the state machine and control logic will attempt to check the value of the write protect CAM's 214 and 216 for those bootblocks. If the WPB input is asserted low, the output of the write protect CAM circuits 214 and 216 will be forced to show that bootblocks 6 and 7 are protected despite the value stored in the CAM's circuits. If the WPB input is asserted high, the output of the write protect CAM circuits 214 and 216 will reflect the stored values. The state machine and control logic receives the WPSB output 704 of the WPCAMS 212 and uses it to determine whether or not a program or erase operation can continue on bootblocks 6 and 7.

In this way, a more convenient write protection scheme is implemented which relies only on the application of the normal operating voltages of the device 100. In addition, in applications where this write protection is not needed, the electrical connections implementing the write protection can be left unconnected without detrimental effects on the internal circuitry or power consumption of the device 100. Further, the input 202 can support mixed functions involving both high voltage and normal operating voltage applications without detrimental effects on the internal circuitry.

It is to be noted that suitable transistor sizes specifying channel width to length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

We claim:

1. An input circuit for a flash memory device, said input circuit comprising:

an input operative to receive a voltage from a source external to said flash memory device, said voltage representing a logic level;

a pull up circuit coupled with said input and operative to pull the voltage of said input to a high logic level when said input receives no voltage from said external source;

a buffer circuit coupled with said input and operative to buffer said voltage; and a high voltage cut off circuit operative to disconnect said buffer from said input when said voltage exceeds a preset high voltage value.

2. The input circuit of claim 1, wherein said preset high voltage value is approximately 10 Volts.

3. The input circuit of claim 1, wherein said input is an input pin.

4. The input circuit of claim 1, wherein said input is a write protect input pin.

5. An apparatus for reducing the standby current draw of a flash memory device capable of simultaneous read/write operation, said apparatus comprising:

an input for receiving a digital logic input from a source external to said flash memory device;

an inverter circuit coupled with said input for inverting said digital logic input, said inverter circuit comprising an output; and a pull up circuit coupled with said inverter circuit, said pull up circuit coupling said output with an electrical ground when said input is floating.

6. The apparatus of claim 5, wherein said pull up circuit is further operative to couple said output to said electrical ground when said input is disconnected from said external source.

7. The apparatus of claim 5, further comprising a high voltage protection circuit for protecting said inverter circuit from high voltages on said input.

8. The apparatus of claim 7, where said high voltage is a voltage greater than 10 Volts.

9. The flash memory device of claim 5, wherein said input is an input pin.

10. The flash memory device of claim 5, wherein said input is a write protect input pin.

11. The input circuit of claim 1, wherein said pull up circuit is further operative to pull the voltage of said input to a high logic level when said input is floating.

12. The input circuit of claim 1, wherein said pull up circuit is further operative to pull the voltage of said input to a high logic level when said input is disconnected.

* * * * *